(12) United States Patent
Yasuzato (10) Patent No.: US 7,691,543 B2
(45) Date of Patent: Apr. 6, 2010

(54) MASK DATA CREATION METHOD (75) Inventor: Tadao Yasuzato, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 948 days.

(21) Appl. No.: 11/414,290

(22) Filed: May 1, 2006

(65) Prior Publication Data

US 2006/0246362 A1 Nov. 2, 2006

(30) Foreign Application Priority Data

May 2, 2005 (JP) ............................ 2005-133834

(51) Int. Cl.
G03F 1/00 (2006.01)
G06F 17/50 (2006.01)

(52) U.S. Cl. ............................................ 430/5; 716/19

(58) Field of Classification Search ................ 430/5; 716/19

See application file for complete search history.

(56) References Cited

U.S. PATENT DOCUMENTS

| | | | |
|---|---|---|---|
| 5,242,770 | A | 9/1993 | Chen et al. |
| 5,447,810 | A | 9/1995 | Chen et al. |
| 5,821,014 | A | 10/1998 | Chen et al. |
| 5,827,623 | A | 10/1998 | Ishida et al. |
| 6,074,787 | A | 6/2000 | Takeuchi |
| 6,249,904 | B1 | 6/2001 | Cobb |
| 6,415,421 | B2 | 7/2002 | Anderson et al. |
| 6,673,638 | B1 | 1/2004 | Bendik et al. |
| 6,869,735 | B2 | 3/2005 | Tamada |
| 7,124,395 | B2 | 10/2006 | Shi et al. |
| 2001/0052107 | A1* | 12/2001 | Anderson et al. ............. 716/19 |
| 2003/0124759 | A1 | 7/2003 | Tsuboi et al. |
| 2004/0139418 | A1* | 7/2004 | Shi et al. ...................... 716/19 |
| 2004/0170905 | A1* | 9/2004 | Liebmann et al. .............. 430/5 |
| 2005/0076321 | A1* | 4/2005 | Smith ........................... 716/19 |
| 2007/0128526 | A1* | 6/2007 | Wallace et al. ................. 430/5 |

FOREIGN PATENT DOCUMENTS

| | | |
|---|---|---|
| JP | 6-242594 | 9/1994 |
| JP | 07-503554 | 4/1995 |
| JP | 09-127677 | 5/1997 |
| JP | 09-508721 | 9/1997 |
| JP | 11-007120 | 1/1999 |
| JP | 2000-066372 A | 3/2000 |
| JP | 2001-100390 A | 4/2001 |
| JP | 2001-513221 A | 8/2001 |
| JP | 2002-116529 A | 4/2002 |

(Continued)

Primary Examiner—Mark F Huff
Assistant Examiner—John Ruggles
(74) Attorney, Agent, or Firm—Foley & Lardner LLP (57) ABSTRACT A method of creating data of a mask for manufacturing a semiconductor device. The mask includes at least one auxiliary pattern arranged adjacent to a line pattern. The at least one auxiliary pattern is allocated in accordance with a rule-based method on the basis of an interval between a first line pattern and a second line pattern adjacent to the first line pattern. Size of the at least one auxiliary pattern is then optimized in accordance with a model-based OPC (Optical Proximity Correction), by shifting edges of the at least one auxiliary pattern and edges for one of the line patterns on the basis of a first light intensity threshold on the at least one auxiliary pattern and a second light intensity threshold on the line patterns.

13 Claims, 10 Drawing Sheets

FOREIGN PATENT DOCUMENTS

| | | |
|---|---|---|
| JP | 2003-195477 A | 7/2003 |
| JP | 2004-054115 A | 2/2004 |
| JP | 2004-503879 A | 2/2004 |
| JP | 2004-103674 A | 4/2004 |
| JP | 2004-133426 A | 4/2004 |
| JP | 2004-280121 A | 10/2004 |
| JP | 2005-510058 A | 4/2005 |
| JP | 2005-148176 A | 6/2005 |

* cited by examiner

MASK DATA CREATION METHOD

This application claims priority to prior Japanese patent application JP 2005-133834, the disclosure of which is incorporated herein by reference.

BACKGROUND OF THE INVENTION

1. Field of the Invention

The present invention relates to a mask data creation method used for manufacturing a semiconductor device, especially a mask data creation method for a mask with auxiliary patterns.

2. Description of the Related Art

An patterns on a device have been becoming more and more miniaturized as density of a semiconductor device increases. For example, a dynamic random access memory (hereinafter referred to as a DRAM) with 1 gigabit of capacity has been made for practical use. In this sort of large capacity DRAM, width of a line and interval between lines, or line and space, and patterns have been miniaturized. A memory cell of the DRAM is composed of one transistor and one capacitor, and a predetermined number of the memory cells are arranged in X and Y directions according to a scale of integration to form a memory cell array area. Reading/writing information to/from the memory cells is performed by driving a circuit including word lines acting as gates to switching transistors and bit lines for reading and writing information to/from capacitors arranged around the memory cell array. The word lines and the bit lines are orthogonal to each other, and are provided as repetition of a pattern, which is made of lines and spaces between the lines.

In a DRAM, memory cells are allocated most densely in a memory cell array area in order to achieve a larger capacity in a limited chip area of the DRAM. As a result, word lines and bit lines are densely arranged in a pattern of repetition of the lines and intervals between the lines, or a line-and-space pattern, in which width of the lines becomes close to a resolution limit defined by a lithography process, which depends on a photolithography device, resist and so forth. Furthermore, circuits such as a sense amplifier, a decoder and the like, are arranged as peripheral circuits in the memory cell array area with the same pitch as the memory cells. Furthermore, on the further outside of the circuits, a control circuit and an input/output circuit are provided. There is a strong demand especially for a higher scale of integration for a DRAM, and effort has been made for achieving a resolution as high as possible.

Here, resolution means a ½ pitch of the smallest periodic pattern which can form a pattern with a practical depth of focus. The depth of focus means a range of focus which can form a pattern in a resist on a light exposure substrate. If the depth of focus is too small, light is not fully irradiated in a direction of film thickness because of unevenness of film thickness of the resist or a surface of the semiconductor, thus a prominent problem occurs in pattern forming. Therefore, it is desirable to use a large depth of focus.

Generally, it is known that a resolution R is proportional to a wavelength of a light exposure source $\lambda$, and inversely proportional to a numerical aperture NA, that is, $R=K1*\lambda/NA$. Here, K1 is a factor dependent on a process. Therefore, an improvement has been made in a photolithography device so that the wavelength of the light exposure source $\lambda$ becomes shorter and the numerical aperture NA becomes higher, namely lower wavelength and higher NA. At present, KrF laser (248 nm of wavelength) and ArF laser (196 nm of wavelength) have been used as exposure sources. And, 0.8 and more for NA is obtained. By virtue of effect of other efforts, a critical size of 100 nm or less has now been achieved.

On the other hand, in lithography in which a mask pattern is transferred from the mask to the semiconductor substrate, it is an important subject to obtain both a smaller resolution and a depth of focus in light irradiation at the same time. It is represented that the depth of focus (DOF) is proportional to the wavelength $\lambda$, and inversely proportional to the square of the numerical aperture NA, that is, $DOF=K2*\lambda/NA^2$. Here, K1 is a factor dependent on a process. Therefore, the depth of focus becomes smaller when a shorter wavelength and higher NA are obtained, and thus, it has been an important subject to secure a depth of focus.

As a method for securing the depth of focus, an oblique incidence illumination method such as zone illumination has been used. This is a method for irradiating only an oblique light to a mask by excluding a vertical light element from the light for illuminating the mask. A quadrupole illumination and the zone illumination have come into practical use. In a conventional usual illumination, image formation state by three-beam interference, in which three beams of zero order diffracted light and ± first order diffracted lights are collected with a projection lens, has been used. On the contrary, in the oblique incidence illumination, one of the ± first order diffracted lights is discarded (irradiated not to enter the projection lens), and two-beam interference, comprising the zero order diffracted light and the rest of the ± first order diffracted lights, is used to form an image.

Comparing the three-beam interference with the two-beam interference in the point of view from the best focus level of the image formation state, the intensity of the light of the two-beam interference is less than that of the three-beam interference since one of the ± first order diffracted light is discarded. However, when paying attention to a beam incidence angle on the image formation surface of the semiconductor substrate, the beam incidence angle for the image formation of the two-beam interference is ½ of that of the three-beam interference. Therefore, an image of the two-beam interference is less blurry when defocused, and sufficient light intensity distribution can be obtained when forming a resist pattern.

Furthermore, as another method, it has been known that it is possible to further increase the depth of focus by using a halftone phase shift mask. A halftone shift phase mask is one in which, a pattern of the mask in the shaded area is formed by a translucent pattern area, so that 2 to 20% of light leaks, is formed on a mask as a shaded area, and a phase of the penetrated light is inverted 180 degrees from a phase of the light of a transparent area adjacent thereto. In the dense pattern made of the line and space described above, the balance of the zero order diffracted light and one of the ± first order diffracted lights is ameliorated and the light intensity is improved when the halftone mask and the oblique incidence illumination are combined by making use of the diffracted light.

This sort of method shows a great effect when applied to the dense pattern made of the line and space described previously, however, the oblique incidence illumination method has little effect to an isolated pattern which does not originate the diffracted light, and thus increase of the depth of focus can not be expected. Here, the isolated pattern includes a case in which the interval between patterns is sufficiently large, and a case in which the interval is relatively close but not as dense as the dense pattern, that is, a middle pitch.

For increasing the depth of focus in the isolated pattern, on the contrary for the case of the dense pattern, decrease of the NA value (the light including only an almost vertical element is irradiated to the mask) and σ value is effective. Here, σ is called a coherence factor, and is represented by a ratio of NA of a lighting optical system and NA of a projection lens. This means that When σ is small, a small light close to a point light source illuminates the mask, and when σ is large, a large light source illuminates the mask. When the halftone phase shift mask is used, an illumination of small σ can also improve the depth of focus. This sort of condition for increasing of the depth of focus of the isolated pattern results in causing an ill effect of miniaturizing the critical size of the dense pattern made of the line and space. Therefore, it has been difficult to satisfy both exposure features of the miniaturized dense pattern and the isolated pattern.

Therefore, a method using a minute pattern called an auxiliary pattern, which do not serve for resolution itself, has been studied in order to satisfy both the dense pattern and the isolated pattern. The auxiliary pattern is also called a light intensity adjustment pattern, an assist bar, a scattered bar, an diffraction bar, or assist feature. By using the mask on which the auxiliary pattern is allocated adjacent to the isolation pattern under a condition of an oblique incident illumination, it is possible to obtain an image formation state which is close to the two-beam interference, and obtain an increased depth of focus. The location and the width of the auxiliary pattern affects the depth of focus of the transferred pattern.

The allocation of the auxiliary pattern is performed during the rule-based OPC process. The OPC stands for Optical Proximity Correction, and means correction in light proximity effect of lithography. Generally, the OPC method is roughly divided into a rule-based OPC and a model-based OPC. The rule-based OPC is a method for correcting a mask pattern based on an amount of correction of the size of a predetermined auxiliary pattern generating portion, by using parameters such as a width of the pattern which is a target for generating the auxiliary pattern, and an interval between the target pattern and a pattern near it, and the like.

On the other hand, the model-based OPC is a method for correcting a mask pattern so that a desired transferred pattern is obtained by using a light intensity simulation based on parameters such as an optical condition, a resist and the like. In order to create a model of the model-based OPC, it is necessary to change the pitch relative to each targeted size in the greater and smaller ranges including the latter, measure the size of the transferred pattern, and match the parameters to be suitable for the measurement result. Then, the light intensity distribution of each portion of the mask is calculated by using the deduced model. Subsequently, the limit of the light intensity by which the resist which has received the light is dissolved is used as a threshold, and correction of the mask size is performed so that a light intensity position of the designated threshold (corresponding to an edge position of a pattern transferred to the resist) becomes a desired size of the transferred pattern.

The reason why the allocation of the auxiliary pattern is carried out by using the rule-based method is that an effective position for allocating the auxiliary pattern is limited. That is, in order to form the image formation state of the two-beam interference, like the case of the dense pattern, the auxiliary pattern should be allocated in a position, adjacent to the pattern, with a fixed pitch interval in which the two-beam interference can occur. Therefore, the model-based OPC which determines an optimal position by performing a simulation for each pattern is not required. The rule-based OPC, which creates a rule table in advance and makes corrections according thereto, is more suitable since the process is speedy.

As described above, the auxiliary pattern can be relatively easily determined by selecting the location to form the two-beam interference between adjoining patterns and allocating so. However, the optimal size (width) of the auxiliary pattern largely depends on a process condition, it is not possible to decide it only by the optical condition. It is desirable that the width of the auxiliary pattern for obtaining an improved effect of the depth of focus is close to the upper limit of the transferred size, but not to be transferred.

However, since whether or not the auxiliary pattern is transferred is largely depend on a photosensitivity of the resist, the optimization of the width had to be experimentally decided by allocating a different width of the auxiliary pattern for each line pattern location. The process of optimizing the size is the most time-consuming part for creating a rule for the mask with the auxiliary pattern. That is, there is a plenty of steps for creating the mask rule.

In a lithography applied to a conventional semiconductor device with a loose rule, in which the smallest line width is on the order of 300 nm, taking into consideration of the dense pattern which is made of the line and space, and a sparse pattern in which adjacent patterns sufficiently distant from each other, it has been a large subject to study an allocation method of the auxiliary pattern for the sparse pattern. U.S. Pat. No. 5,242,770 and U.S. Pat. No. 5,447,810 disclose allocation methods relating to this.

However, a lithography applied to a semiconductor device with a current severe rule, such as a rule in which the smallest line width is on the order of 100 nm, a size correction of the adjoining pattern with the middle pitch, in which a pattern interval is relatively close but not as dense as the dense pattern, is an important subject, rather than the sparse pattern. Since the middle pitch is largely used for a peripheral circuit located around the periphery of the memory array described previously, the interval thereof is not fixed but varied. Conventionally, since a pattern width was wide, it has been possible to treat as a sparse pattern in which each of the adjoining patterns allocated in the peripheral circuit are not affected by each other, or the effect can be ignored.

However, nowadays, in order to meet a demand for improving a scale of integration, the pattern width became narrow, and each pattern has to be allocated close to each other, thus an effect among each pattern can not be ignored even in the peripheral circuit. As described above, it is necessary to study the optimal width of the auxiliary pattern for allocating thereof for using in the middle pitch pattern with various intervals. Therefore, it causes to require more time for a creating mask rule, and this enlarges the problem.

U.S. Pat. No. 5,821,014 discloses a method for allocating an auxiliary pattern having a different width case by case in order to allocate the auxiliary pattern to various pitch patterns. In this disclosure, the auxiliary pattern allocation is examined by matching the auxiliary patterns with different width until the optimal pattern is obtained, therefore mask creation time is increased as described above. Furthermore, Japanese Unexamined Patent Publication No. H6-242594 discloses an allocation method for an auxiliary pattern for a middle pitch pattern. However, it does not mention difficulty for deciding width of the auxiliary pattern to be located for various middle pitches.

As described above, conventionally, three parameters, that is, the location, the number, and the width of the auxiliary pattern have been decided by using the rule-based OPC. The location of the auxiliary pattern, and the number of the auxiliary pattern can be set easily by using an optical condition and a predetermined rule, respectively. However, as a circuit becomes miniaturized, it has been required greater amount of time for deciding the width of the auxiliary pattern to handle patterns with various width and intervals. According to miniaturization of the pattern, pattern correction has been necessary even for the middle pitch pattern on a mask, which had been treated as a sparse pattern. Various sizes are used in the middle pitch pattern, and thus a problem that a great amount of time is required for deciding a rule in a rule-based OPC occurs.

SUMMARY OF THE INVENTION

An object of the present invention is to provide a mask data creation method for easily performing optimization of a width of an auxiliary pattern for obtaining a desired middle pitch transfer pattern on a semiconductor substrate by allocating an optimal auxiliary pattern, which is adjacent to a middle pitch pattern on the mask, but not transferred.

To solve the above problems, the present invention basically employs technique described below.

As one aspect of the present invention, a method of creating data of a mask for manufacturing a semiconductor device, the mask comprising at least one auxiliary pattern arranged adjacent to a line pattern, comprising: a step of allocating an auxiliary pattern in accordance with a rule-based OPC (Optical Proximity Correction) on the basis of an interval between a first line pattern and a second line pattern adjacent to the first line pattern; and a step of optimizing the size of the auxiliary pattern in accordance with a model-based OPC is provided.

The step of optimizing may comprise: a first optimizing step of sifting edges of the auxiliary pattern by using a first light intensity threshold; and a second optimizing step of shifting edges of the pattern by using a second light intensity threshold.

The first light intensity threshold is preferably higher than the second light intensity threshold. In particular, the first light intensity threshold is preferably from 4% to 40% higher than the second light intensity threshold.

In the first optimizing step, an offset may be given to the auxiliary pattern so that a 0 nanometer width is transferred.

The width of the auxiliary pattern allocated in the step of allocating may be fixed.

It may be preferable that: a table including relationship between ranges of the interval between the first line pattern and the second line pattern and positions where the auxiliary pattern is allocated; and in the step of optimizing, the width of the auxiliary pattern and the width of the first and second line patterns are optimized. In this case, the table may further include relationship between the ranges and numbers of auxiliary patterns to be allocated.

According to the aspect of the present invention, by making use of the fact that, as in the same way as of a pattern, an auxiliary pattern with a narrow width can be also corrected by using a model-based OPC within a certain range of the interval of the auxiliary pattern, the width of the auxiliary pattern is optimally corrected by using a model-based OPC while taking account of a result of the pattern correction, after the auxiliary pattern with a fixed width is allocated by using the rule-based OPC. Thereby, the width of the auxiliary pattern can be constant by the rule-based OPC, thus the description of the rule becomes quite easy and it is possible to improve effectiveness of mask creation. Furthermore, even a circuit formed on a semiconductor substrate is miniaturized, and a decision of a pattern width and its allocation become complicated, the present invention is effective for providing a mask for manufacturing a semiconductor device with higher scale of integration since it is possible to easily handle optimization of the pattern and the auxiliary pattern by subdividing cases of various pattern intervals.

DESCRIPTION OF THE PREFERRED EMBODIMENTS

The preferred embodiments of the present invention are now described. The present invention relates to a mask data creation method of a mask having a closely dense area where line patterns are arranged closely adjacent to each other at an interval of the smallest design dimension, a sparse area where line patterns are practically not so closely adjacent to each other, and a middle area which is in a dense state between the closely dense area and the sparse area, in which an auxiliary pattern is allocated adjacent to the line pattern of the middle area so that the line patterns of the middle area pattern are transferred precisely under the exposure environment in which an exposure wavelength of 248 nm or less, and a size of 120 nm or less are provided.

The present invention uses a method in which, an allocated location of an auxiliary pattern for improving a depth of focus while a middle pitch pattern on a mask is transferred to a semiconductor substrate is determined based on an illumination condition, and a width of the auxiliary pattern is determined based on photosensitivity of a resist. The allocation location of the auxiliary pattern is allocated so that zero order diffracted light and one of ±first order diffracted lights among the diffracted lights for the middle pitch pattern and the auxiliary pattern pass through a pupil plane of a projection lens and realizes a two beam image formation on the semiconductor substrate. Therefore, the allocation location of the auxiliary pattern can be determined only by an optical condition (NA of the projection lens, and the illumination condition).

On the other hand, an optimal width of the auxiliary pattern largely depends on the photosensitivity of the resist as well as the optical condition. For example, chemical amplification resist used in a lithography using KrF laser (a wavelength of 248 nm) as a light source, when acid diffusion length is short, even a thin auxiliary pattern can be transferred easily, and when the acid diffusion length is long, even a relatively thick auxiliary pattern is not easily transferred. This sort of the optical condition and the photosensitivity of the resist can be taken as a model of a model-based OPC, and a transferability can be determined by using the model-based OPC.

In the present invention, the auxiliary pattern is allocated at an allocation position where the depth of focus determined by the optical condition can be increased, by using the rule-based OPC, and then a width of the auxiliary pattern after it is allocated is optimized by using the model-based OPC which includes all aspects of the photosensitivity of the resist. In detail, the mask data creation method of the present invention includes a step of generating the auxiliary pattern by using the rule-based OPC with a rule in which the width of the auxiliary pattern to be allocated between middle pitched patterns is fixed; and a step for optimizing the width of the auxiliary pattern with a higher threshold than the middle pitch pattern by using the model-based OPC. Unlike U.S. Pat. No. 5,821, 014 described above, it is not necessary to experimentally search an optimal auxiliary pattern by repeating evaluation by matching various auxiliary patterns with different widths in the middle pitch pattern.

As described in later embodiments, the threshold mentioned above is the value of irradiation light intensity as an index indicating whether or not the resist is dissolved during development when light which has a certain light intensity distribution and has passed through the mask is irradiated to the resist. The threshold is such that the resist is dissolved above that value of light intensity, and the resist remains as the pattern without being dissolved under the value.

Embodiment 1

More specific example is explained in this embodiment referring to figures. A DRAM is used as an example in the embodiment, and a mask data creation method using a lithography step for simultaneously forming a dense pattern making a memory cell array and a middle pitch pattern making a peripheral circuit. In the hypothesis for the explanation, the exposure device uses a KrF scan method, in which a reduction magnification is 4, a numerical aperture (NA) is 0.85, a coherence factor ($\sigma$) is 0.85, and ⅔ zone illumination. The ⅔ zone illumination means that a central portion corresponding to ⅔ of radius is shielded. A line and space in the memory cell array portion is 100 nm, and a pattern width making the middle pitch pattern of the peripheral circuit potion is 160 nm. Furthermore, the width of the auxiliary pattern is 80% of the size in the memory cell array portion, that is 80 nm.

First, a rule for allocating the auxiliary pattern is decided by using a rule-based method. The allocation position of the auxiliary pattern is determined so that two-beam interference state is achieved by allocating the same. In this case, complete two-beam interference state is not achieved unless a condition of using a strong oblique incidence illumination such as a bipolar illumination is met. Accompanying to this, the allocation position of the auxiliary pattern which has an effect of increasing a depth of focus has a certain range. Therefore, the allocation can be done with some extra room. Since the present invention has the hypothesis of using the ⅔ zone illumination, it has the above described advantage, and it is not necessary to allocate the auxiliary pattern in a severely specified position. Here, a method for allocating the auxiliary pattern according to pattern intervals of the middle pitched pattern shown in Table 1 is described. In Table 1, there are 5 cases each of which has a different pattern interval. For the each case, a pattern interval, the number of auxiliary patterns, and the distance between edges of the pattern and the auxiliary pattern as a location of the auxiliary pattern are shown.

TABLE 1

Figure 1:
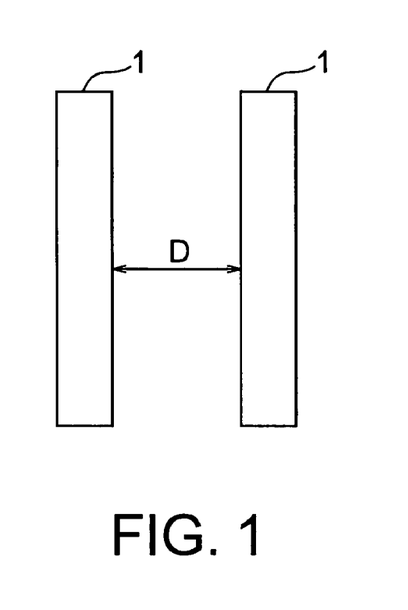
FIG. 1 is a view of a pattern allocation, in which a pattern interval is less than 300 nm, and an auxiliary pattern is not allocated.
Figure 2:
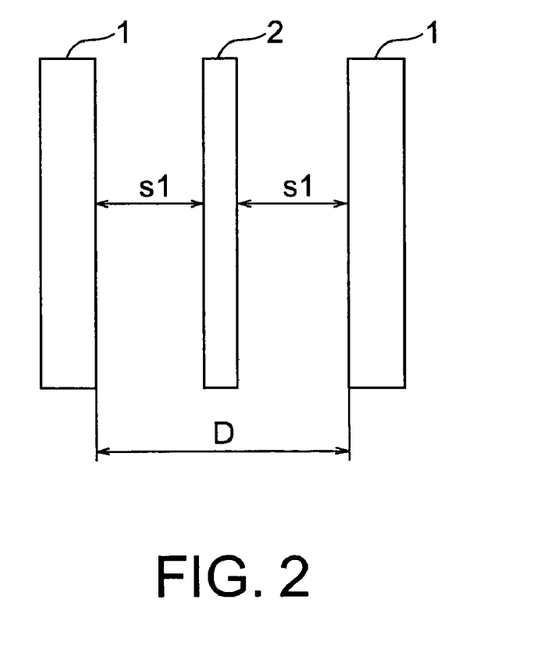
FIG. 2 is a view of a pattern allocation, in which the pattern interval is 300 nm or more, and less than 490 nm, and the auxiliary pattern is allocated by a rule-based method of the present invention.
Figure 3:
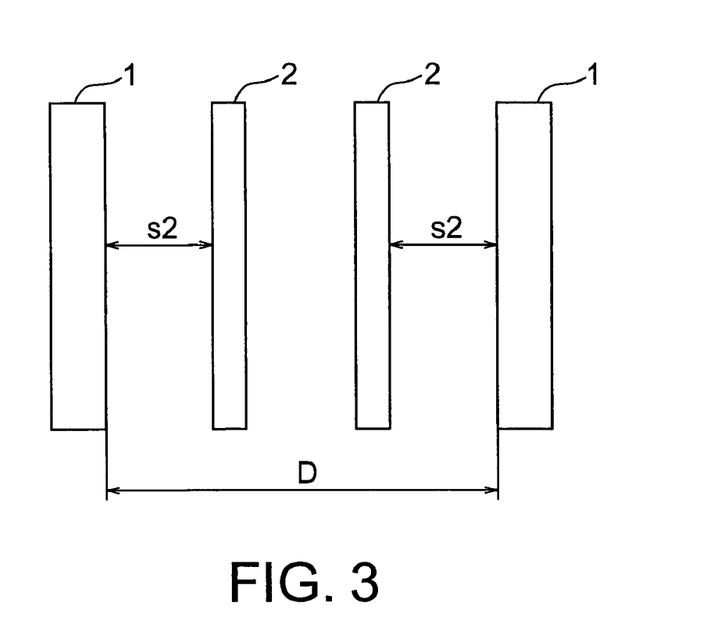
FIG. 3 is a view of a pattern allocation, in which the pattern interval is 490 nm or more, and less than 720 nm, and the auxiliary pattern is allocated by the rule-based method of the present invention.
Figure 4:
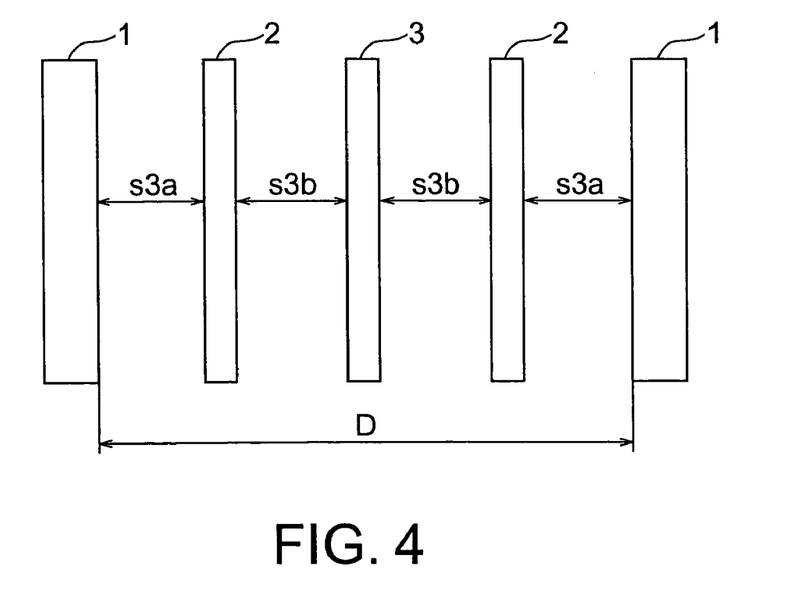
FIG. 4 is a view of a pattern allocation, in which the pattern interval is 720 nm or more, and less than 920 nm, and the auxiliary pattern is allocated by the rule-based method of the present invention.
Figure 5:
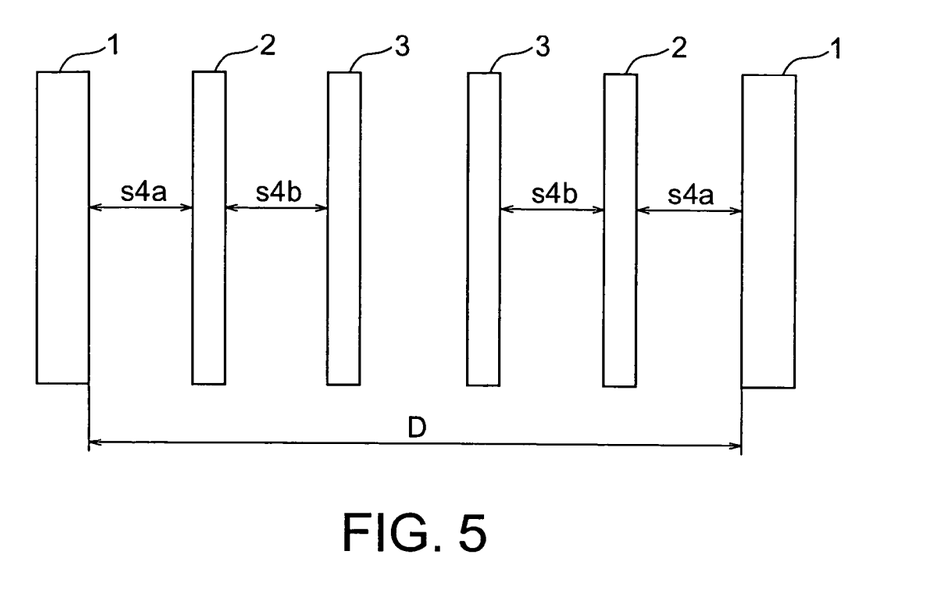
FIG. 5 is a view of a pattern allocation, in which the pattern interval is 920 nm or more, and the auxiliary pattern is allocated by the rule-based method of the present invention.

| | INTERVAL BETWEEN LINE PATTERNS D (nm) | NUMBER OF AUXILIARY PATTERNS | LOCATION (nm) | FIGURE OF AUXILIARY PATTERN LOCATION |
|---|---|---|---|---|
| Case 1 | D < 300 | 0 | | FIG. 1 |
| Case 2 | 300 ≦ D < 490 | 1 | s1 = D/2 − 40 | FIG. 2 |
| Case 3 | 490 < D < 720 | 2 | s2 = 110 | FIG. 3 |
| Case 4 | 720 < D < 920 | 3 | s3a = 110 s3b = D/2 − 230 | FIG. 4 |
| Case 5 | 920 < D | 4 | s4a = 110 s4b = 130 | FIG. 5 |

In case 1, the pattern interval D is less than 300 nm, and FIG. 1 shows the allocation of the case 1. Adjacent two patterns are allocated with the interval D. When the pattern interval D is less than 300 nm, the auxiliary pattern is not allocated. This is because even if the auxiliary pattern is allocated, the interval between the edge of the pattern and the edge of the auxiliary pattern is too narrow to cause an adverse effect which surmounts the effect of the two-beam interference.

In case 2, the pattern interval D is not less than 300 nm and less than 490 nm, and FIG. 2 is a figure showing the allocation of the case 2. An auxiliary pattern 2 is allocated in the middle of two adjacent patterns 1 which are separated with the interval D. An interval s1 between the edge of the pattern and the edge of the auxiliary pattern is a value of subtracting 40 nm (the half of the width of auxiliary pattern) from D/2, and this will be 110 nm or more, and smaller than 205 nm.

In case 3, the pattern interval D is more than 490 nm, and less than 720 nm, and FIG. 3 shows the allocation of the case 3. Between the two adjacent patterns 1 which are separated with the interval D, two auxiliary pattern 2 are allocated. An interval s2 between the edge of the pattern and the edge of the auxiliary pattern is 110 nm, and in this case, the interval between the adjacent auxiliary patterns 2 is 110 nm or more, and less than 340 nm.

In case 4, the pattern interval D is more than 720 nm and less than 920 nm, and FIG. 4 shows the allocation of the case 4. Between the adjacent patterns 1 which are separated with the interval D, three auxiliary patterns 2 are allocated. An interval s3a between the edge of the pattern 1 and the edge of the auxiliary pattern 2 adjacent to the edge of the pattern 1 is 110 nm, and one auxiliary pattern 2 is allocated adjacent to the edge of each pattern 1. Also, in the middle of the adjacent patterns 2, one auxiliary pattern 3 is allocated. An interval s3b between the edge of the auxiliary pattern 2 and the edge of the auxiliary pattern 3 is 130 nm or more, and lass than 230 nm.

In case 5, the pattern interval D is more than 920 nm, and FIG. 5 shows the allocation of the case 5. In this case, two auxiliary patterns are allocated on one side of the pattern 1. An interval s4a between the edge of the pattern 1 and the edge of the auxiliary pattern 2 is 110 nm, and an interval s4b between the edge of the auxiliary pattern 2 and the edge of the auxiliary pattern 3 is 130 nm. The state of the adjacent patterns 1 is shown in FIG. 5. If the pattern interval D is 920 nm or more, each pattern can be a completely isolated pattern and can allocate the auxiliary pattern.

In the above rule, after the auxiliary pattern of which width is fixed to 80 nm is allocated, the model-based OPC to which photosensitivity of the resist is input is applied, so that pattern size correction and auxiliary pattern size correction are repeated in a pattern generation device, and thus the pattern and the auxiliary pattern are optimized. In this instance, a result is explained, in which the OPC is applied in a model which is created under a condition of a relatively long 50 nm of acid diffusion length which indicates a characteristic parameter of a chemical amplification resist, by using the chemical amplification resist for the KrF laser light source (a wavelength of 248 nm).

Figure 6:
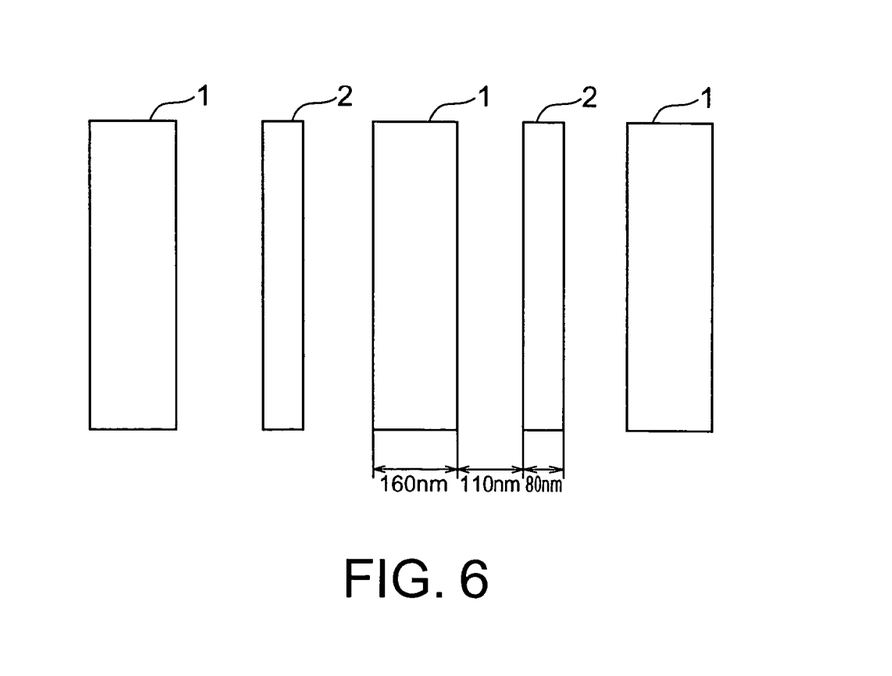
FIG. 6 is a view of a pattern allocation, in which the pattern interval is 300 nm, and the auxiliary pattern is allocated by the rule-based method of the present invention.
Figure 7:
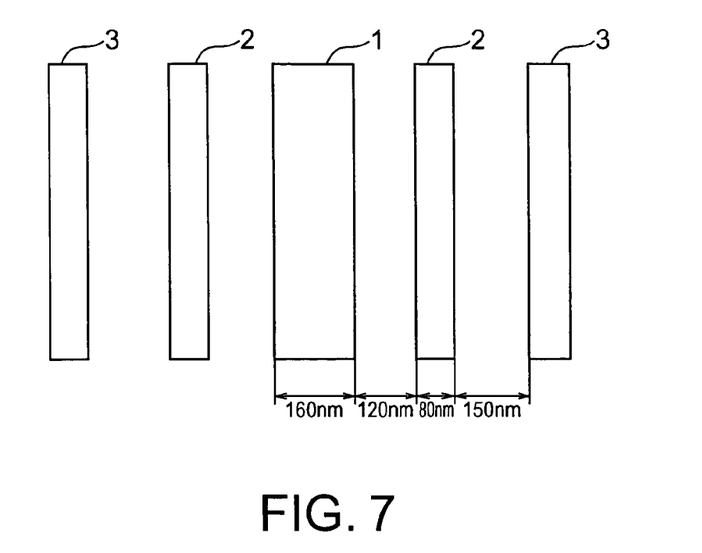
FIG. 7 is a view of a pattern allocation, which is a case of an isolated pattern, and in which the auxiliary pattern is allocated by the rule-based method of the present invention.
Figure 8:
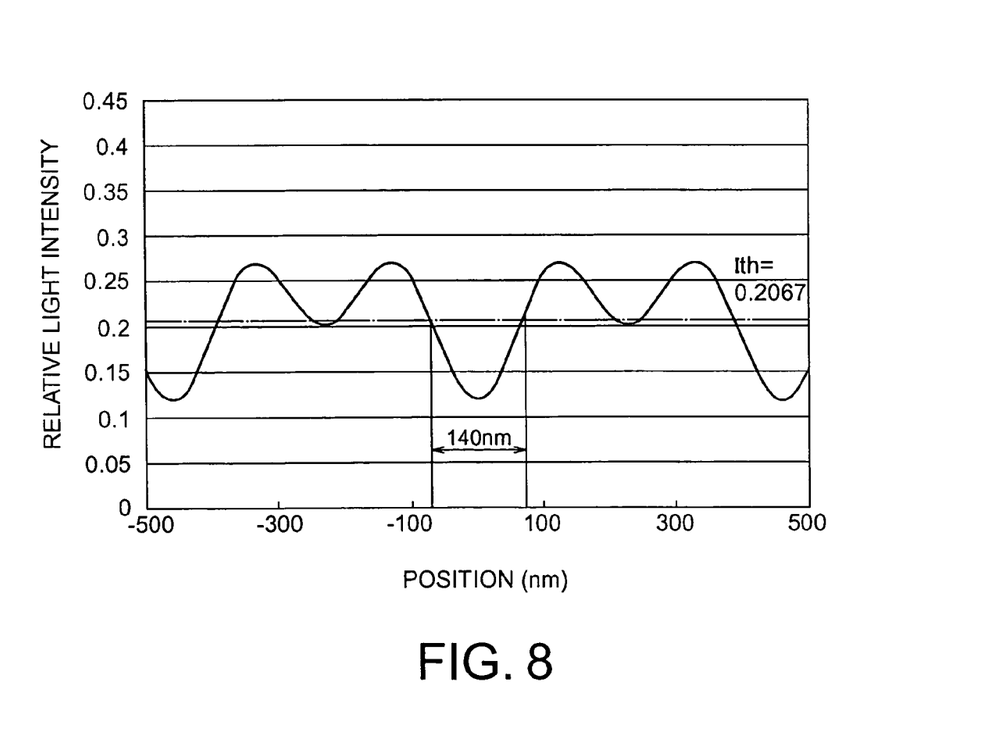
FIG. 8 is a view of a relative light intensity distribution in an embodiment 1 relative to the pattern allocation of FIG. 6.
Figure 9:
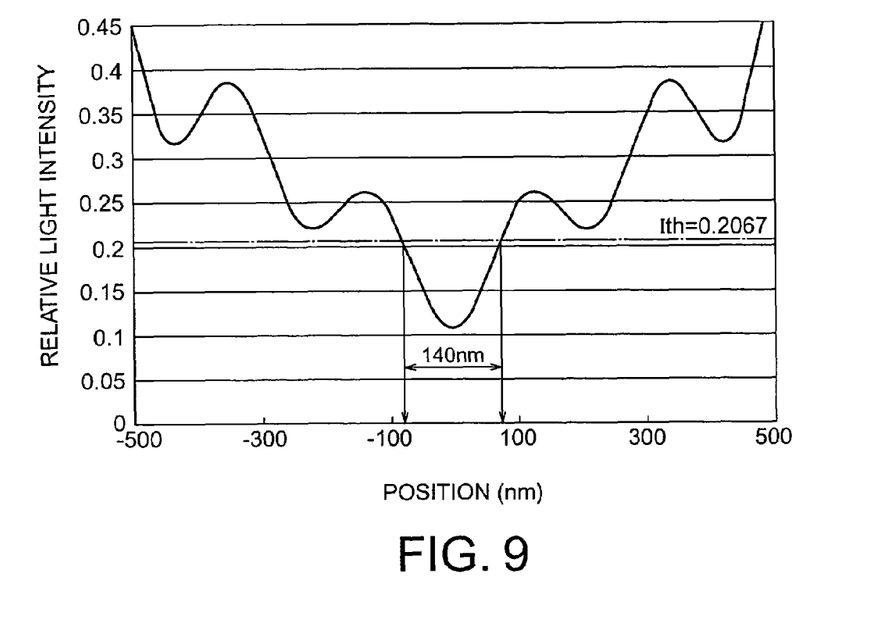
FIG. 9 is a view of the relative light intensity distribution in the embodiment 1 relative to the pattern allocation of FIG. 7.

Patterns immediately after the auxiliary patterns having the width of 80 nm by using the above-described rule are shown in FIG. 6 and FIG. 7. FIG. 6 shows a case corresponding to the case 2 in which the interval between the line patterns having the space of 300 nm, and one auxiliary pattern is allocated between the line patterns. This is a case in which the auxiliary pattern is allocated between the most dense line patterns. FIG. 7 shows case corresponding to the case 5, in which two auxiliary patterns are allocated in the right an the left of the isolated line pattern having the width of 160 nm, around which there are sufficient space and no other patterns exist. FIG. 8 and FIG. 9 show relative light intensity distributions on light exposure substrates obtained by the mask patterns shown in FIGS. 6 and 7 before the model-based OPC process. The abscissa axis indicates a location on a semiconductor substrate, and corresponds to locations of the pattern and the auxiliary pattern.

FIG. 8 corresponds to a state in which three patterns having the width of 160 nm are allocated around points of 0 nm, 460 nm, and −460 nm on the semiconductor substrate, and one auxiliary pattern having the fixed width of 80 nm is allocated in the center of each interval, respectively. The interval between respective pattern edges is 300 nm. Further, the interval between the edge of the pattern and the edge of the auxiliary pattern is 110 nm. Furthermore, in the figure of the relative light intensity distribution shown in FIG. 9, the center of the line pattern is located in the position of 0 nm on the semiconductor substrate, and the centers of the auxiliary patterns having the width of 80 nm are located in +/−230 nm and +/−440 nm. The ordinate axes of respective figures indicate the relative light intensity. The relative light intensity is a relative value, in which the light intensity of a complete shielded portion is 0, and the light intensity of a sufficiently wide light transmission portion is 1. If the value is large, a light transmission amount is large, and if the value is small, the light transmission amount is small.

First, the auxiliary pattern with a fixed width is allocated as mentioned above, next, the sizes of the auxiliary patterns and the line patterns are adjusted by using the model-based OPC. The threshold value of the relative light intensity of patterns when applying the model-based OPC to the line patterns is set to 0.2067. This value is a value set such that the pattern with a 100 nm line and space width in a dense portion of a memory cell array is formed as require as a designed value. The threshold means a level of the relative light intensity in which a resist pattern is formed in a range of the relative light intensity smaller than the threshold, and the resist is eliminated during development in a range of the relative light intensity larger than the threshold. In FIG. 8 and FIG. 9, observing intersection points at which the threshold value of 0.2067 crosses the relative light intensity, it can be seen that a pattern having opposite edges at the intersection points, and in this case, even though a pattern with a width of 160 nm is allocated, only a pattern with about a 140 nm width is obtained. Furthermore, there are some portions in the auxiliary pattern at which the auxiliary pattern portion falls lower than the threshold, and thus the auxiliary pattern itself is also transferred.

In this way, the auxiliary pattern with a fixed width is first allocated as mentioned above, and the size of the auxiliary pattern and the size of the line pattern are adjusted by using the model-based OPC. The concept of OPC is described in FIG. 10. Since the line pattern is a pattern to be transferred to the semiconductor substrate, a mask size is corrected so that a desired size is obtained with a light intensity threshold Ith at which other patterns (for example, a memory call array) to which OPC is not applied becomes a desired size. On the other hand, since the auxiliary pattern is a pattern which is not transferred to the semiconductor substrate, it is not possible to correct it by using the same light intensity of Io. The lowest light intensity Imin for the auxiliary pattern portion should be greater than the light intensity threshold Ith, and taking account of a transferring margin when the amount of light exposure is shifted to underexposure, it is necessary to set the light intensity to a value a few % to a few dozen % higher than the light intensity Ith.

Figure 10:
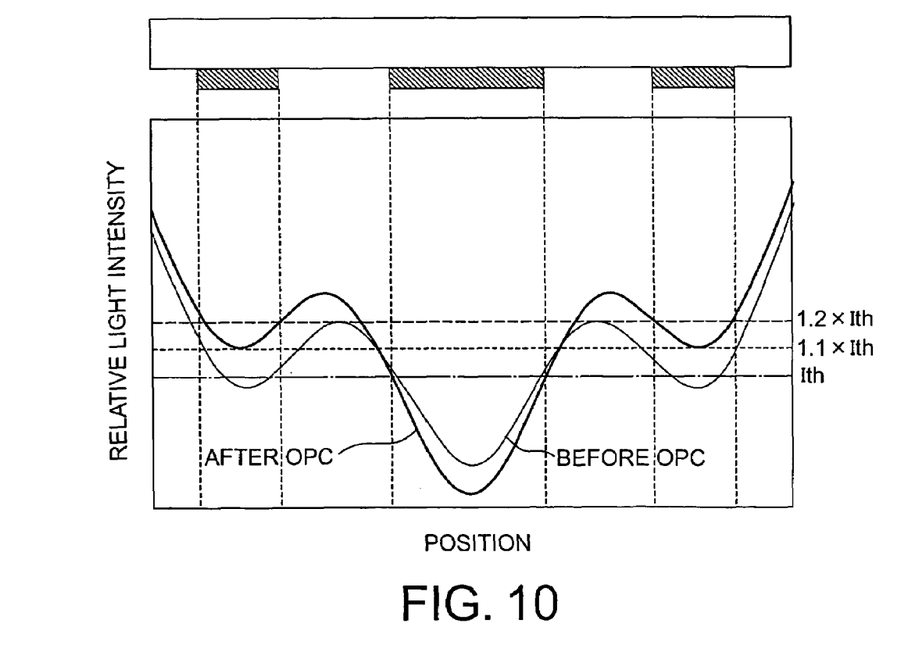
FIG. 10 is a view for explaining an outline of a model-based OPC.

For example, by correcting the auxiliary pattern with a light intensity value 30% higher than the light intensity Io, the lowest light intensity Imin of the auxiliary pattern can be greater than or equals to the light intensity threshold Ith. Also, the lowest light intensity Imin of the auxiliary pattern portion can be more than the light intensity threshold Ith, by adding bias to a target size of OPC of the auxiliary pattern and performing OPC process so that an extremely small size (for example about 10 nm) can be obtained with a light intensity such as one about 10% higher than the light intensity threshold Ith. Furthermore, if the lowest light intensity Imin of the auxiliary pattern is unnecessarily greater than the threshold Ith for forming a line pattern an effect of increasing the depth of focus of the line pattern, that is an original purpose of allocating the auxiliary pattern, is lost. Therefore, it is desirable that the lowest light intensity Imin be within an appropriate range which is relatively higher than the light intensity threshold Ith (1.4×Ith>Imin>1.05×Ith).

In the condition of the present embodiment, the light intensity threshold Ith for forming a memory cell array patterns having a line and space of 100 nm to a designed size, is 0.2067. Therefore, the threshold 0.2067 is set for the line pattern, and the threshold of 0.22737, which is 10% higher than the threshold Ith, is set for the auxiliary pattern. Also, a bias of −40 nm for one side, is added to the OPC target size of the auxiliary pattern, and the OPC process is performed with the threshold of 0.2273 so that a size of o nm is obtained on the semiconductor substrate.

Figure 11:
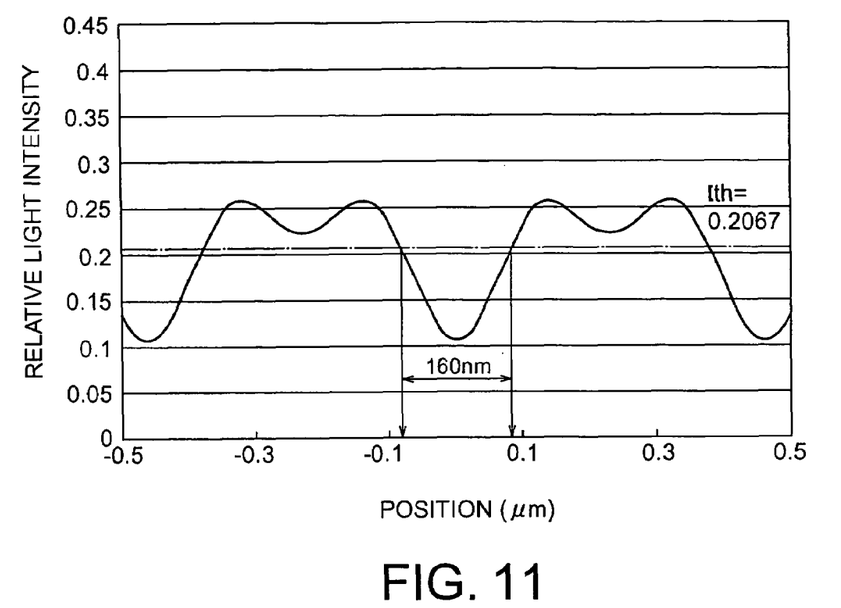
FIG. 11 is a view of the relative light intensity distribution after a process of the model-based OPC in the embodiment 1 relative to the pattern allocation of FIG. 6, and after correction.
Figure 12:
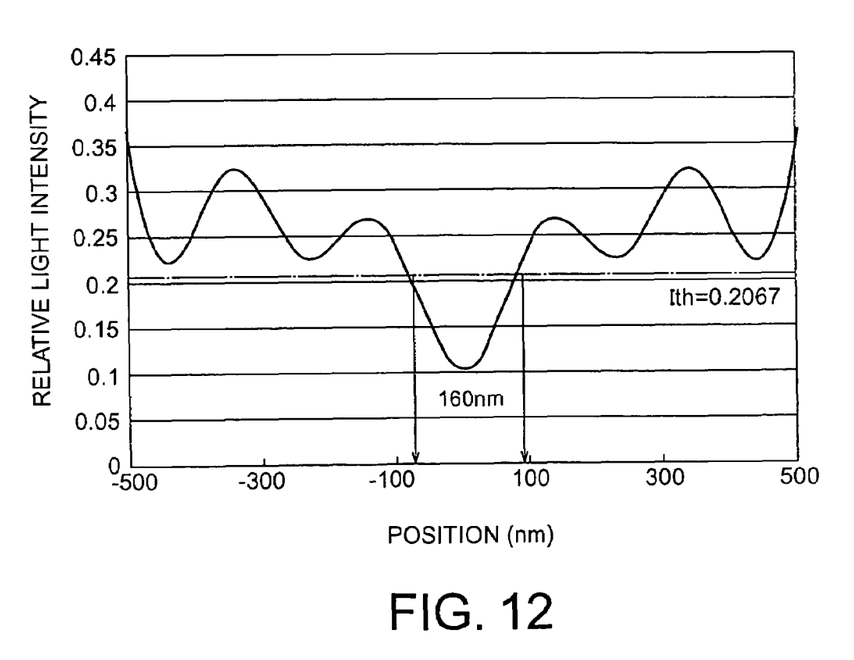
FIG. 12 is a view of the relative light intensity distribution after the process of the model-based OPC in the embodiment 1 relative to the pattern allocation of FIG. 7, and after correction.

FIGS. 11 and 12 show the relative light intensity distribution of the pattern after correction of the model-based OPC corresponding to FIG. 8 and FIG. 9. The relative light intensity of the auxiliary pattern after correction becomes almost 10% higher than the threshold Ith=0.2067 with which the line pattern is formed, and it becomes clear that it is not transferred with a condition in which other patterns are transferred on the semiconductor substrate (a condition with which the pattern is formed with the light intensity threshold Ith). Also, it is possible to obtain a pattern with a desired width of 160 nm for the line pattern with the threshold Ith=0.2067. Furthermore, the light intensity of the auxiliary pattern portion also becomes over the light intensity threshold Ith, and transfer to the semiconductor substrate does not occur.

Figure 13:
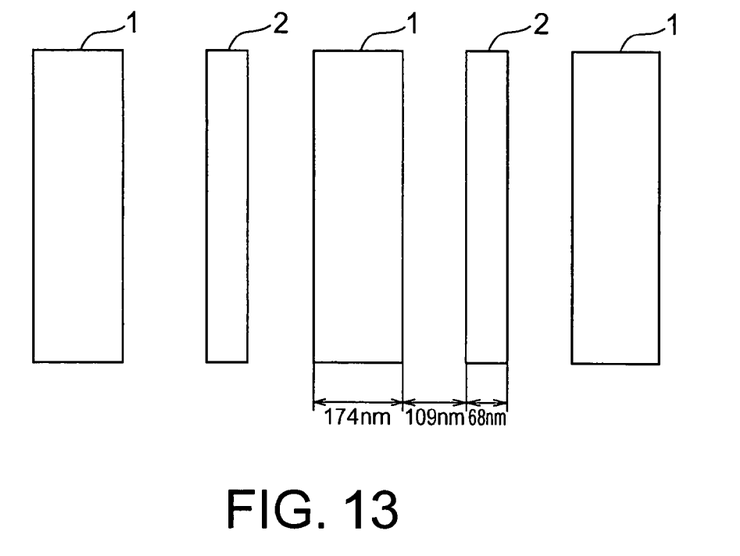
FIG. 13 is a view of pattern allocation after the process of the model-based OPC in the embodiment 1 relative to the pattern allocation of FIG. 6, and after correction.
Figure 14:
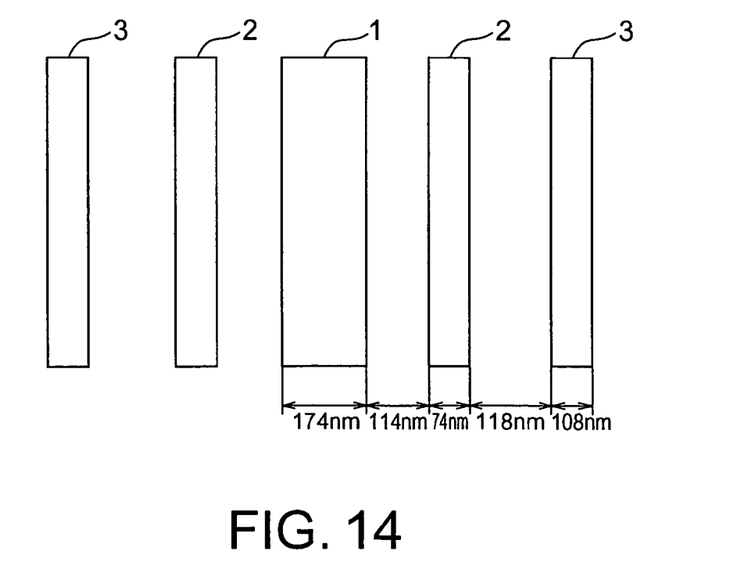
FIG. 14 is a view of pattern allocation after the process of the model-based OPC in the embodiment 1 relative to the pattern allocation of FIG. 7, and after correction.

FIGS. 13 and 14 show mask patterns after the OPC correction. In a dense pattern in FIG. 13 (the line pattern interval of 300 nm based on case 1), the width of the line pattern is optimized from 160 nm to 174 nm, and the width of the auxiliary pattern 2 is optimized from 80 nm to 68 nm. The interval between the edge of the pattern and the edge of the auxiliary pattern is shortened from 110 nm to 109 nm. Also, in the isolated pattern of FIG. 14 (case 5), the width of the line pattern is optimized from 160 nm to 174 nm, and the width of the auxiliary pattern 2 is optimized from 80 nm to 74 nm, and the width of the auxiliary pattern 3 is optimized from 80 nm to 108 nm. The interval between the edge of the pattern and the edge of the auxiliary pattern becomes from 110 nm to 114 nm and the interval between the auxiliary patterns is shortened from 130 nm to 118 nm.

Here, for the convenience of explanation, the case in which the auxiliary pattern is allocated between the most dense patterns as the middle patterns (the interval is 300 nm), and the case in which two auxiliary patterns are allocated in the left and right of the isolated pattern (the interval is 920 nm or more) are described above as examples, however, corrections are possible also in other cases. Also, in the present embodiment, 4 cases with different pattern intervals are described, however, it is possible to easily adapt to more minutely divided cases.

According to the present embodiment, the auxiliary pattern with a fixed width is allocated by using the rule-based method, with the number and the place thereof depending on the line interval. Then, the width of the auxiliary pattern and the width of the pattern are optimized by using the model-based OPC. As a result, it is possible to obtain a mask in which the width of the pattern and the width of the auxiliary pattern are corrected properly on the mask, the auxiliary pattern is not transferred to the semiconductor substrate, and the depth of focus of the pattern in the semiconductor element can be increased as much as possible. There is an advantage for being able to largely reduce time and cost conventionally required to determine suitability when allocating the auxiliary pattern with a different width for various cases by using the rule-based method.

Embodiment 2

Next, in a second embodiment, a result of a case in which OPC is conducted to a model created by setting acid diffusion length of the resist to relatively short, 10 nm. In this embodiment, as a first step, an application is made to FIG. 6 and FIG. 7 in which the patterns are allocated by using the rule-based method like the first embodiment.

Figure 15:
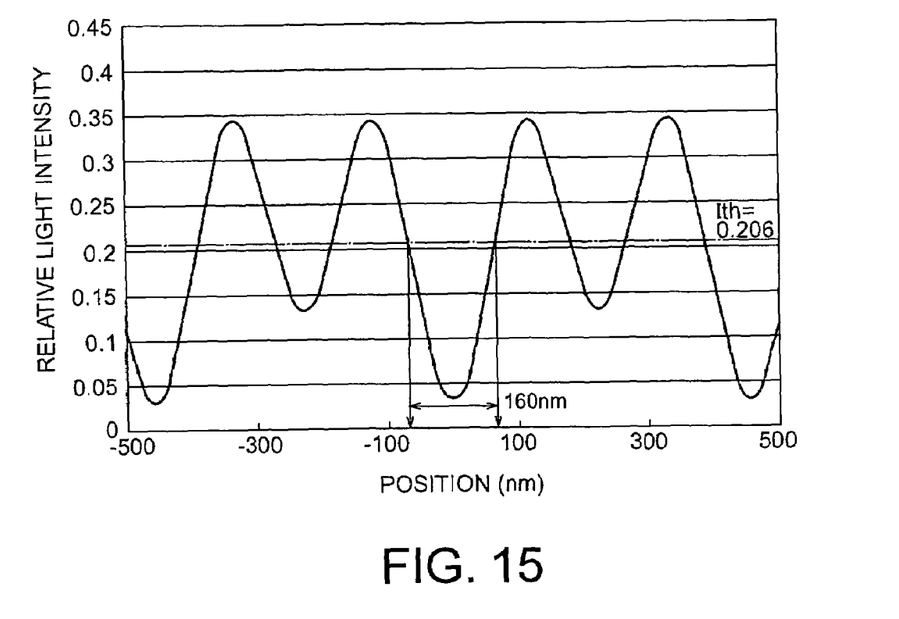
FIG. 15 is a view of the relative light intensity distribution in an embodiment 2 relative to the pattern allocation of FIG. 6.
Figure 16:
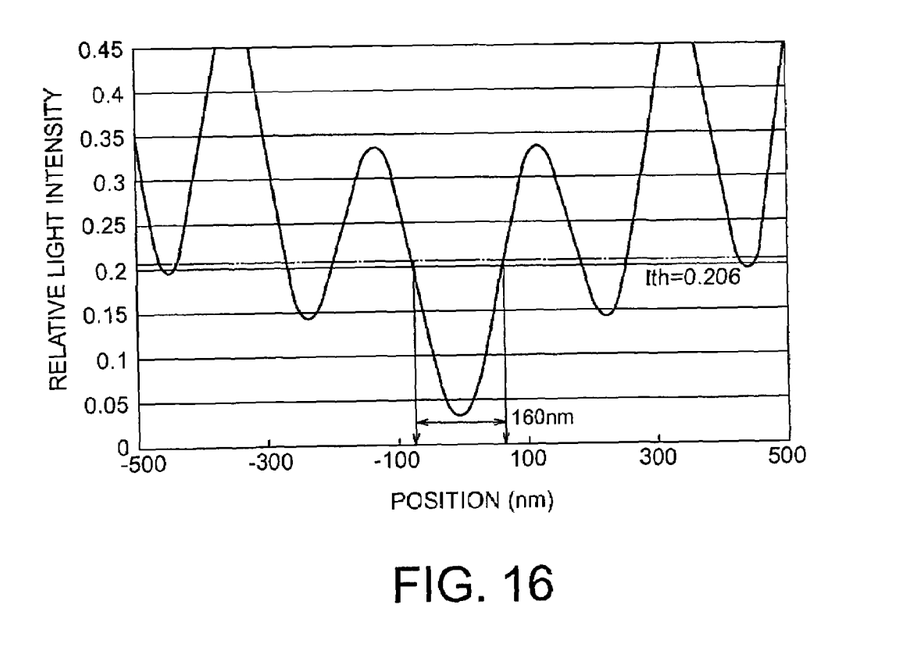
FIG. 16 is a view of the relative light intensity distribution in the embodiment 2 relative to the pattern allocation of FIG. 7.

FIG. 15 shows the relative light intensity distribution immediately after allocating the auxiliary pattern by using the rule-based method when the interval is 300 nm, like the embodiment described above. Further, FIG. 16 shows the relative light intensity distribution immediately after allocating the auxiliary pattern having the width of 80 nm on the right and left sides of the isolated line pattern. When the acid diffusion length is short, deterioration is less, so that steepness of the light intensity distribution is maintained. Therefore, the light intensity of the auxiliary pattern portion decreases, and the auxiliary pattern becomes easier to be transferred. The threshold of 0.2060 for the pattern is set with respect to the resist with this sort of the relative light intensity distribution, so that the dense portion of the memory array becomes a designed value, like the embodiment 1. On the other hand, the relatively high threshold of 0.2266 which is 10% higher than that for the line pattern is set for the auxiliary pattern, and also a bias of −40 nm is added to the target size. Furthermore, OPC process is performed so that 0 nm size is obtained with the threshold of 0.2266 on the semiconductor substrate.

Figure 17:
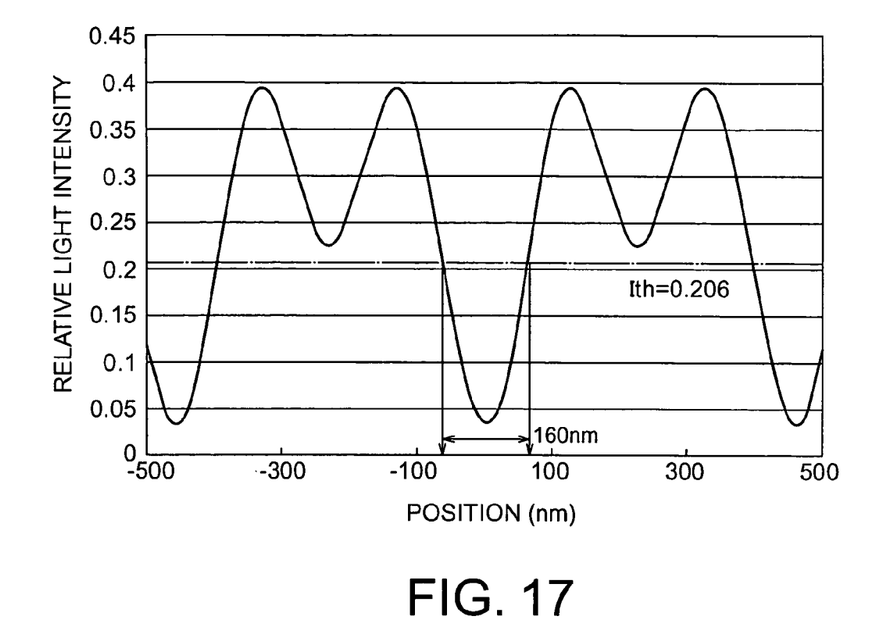
FIG. 17 is a view of the relative light intensity distribution after the process of the model-based OPC in the embodiment 2 relative to the pattern allocation of FIG. 6, and after correction.
Figure 18:
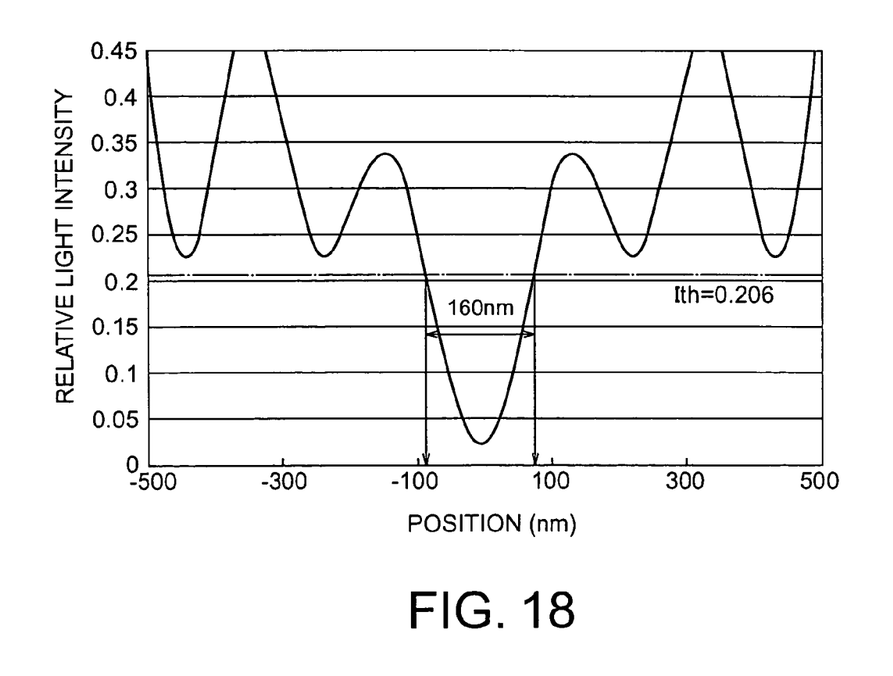
FIG. 18 is a view of the relative light intensity distribution after the process of the model-based OPC in the embodiment 2 relative to the drawing of the pattern allocation of FIG. 7, and after correction.

FIGS. 17 and 18 show the relative light intensity distributions after OPC correction of the dense pattern (the interval is 300 nm) and the isolated line pattern (the interval is 920 nm or more), respectively. After the correction, the level of the relative light intensity of the auxiliary pattern portion is close to 0.2266, and thus transfer of the auxiliary pattern is prevented. Also, if the line pattern is left as the resist pattern when the threshold is less than 0.2060, a designed size of 160 nm can be achieved.

Figure 19:
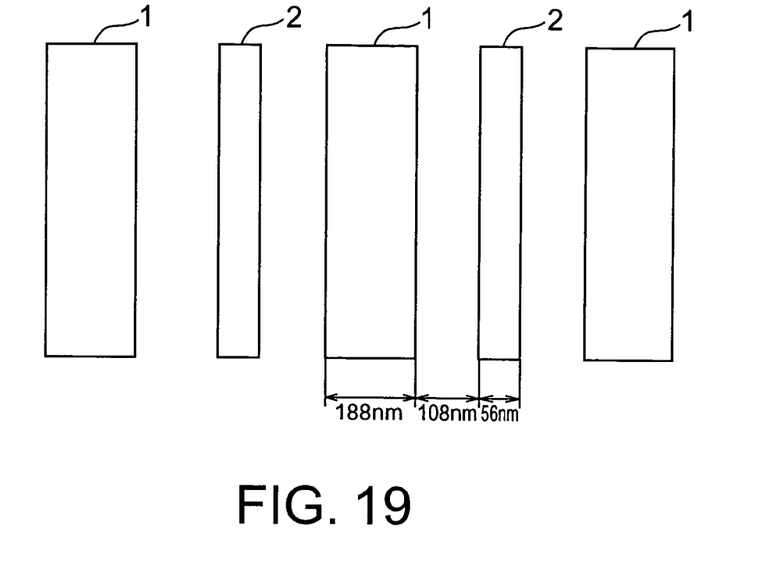
FIG. 19 is a view of pattern allocation after the process of the model-based OPC in the embodiment 2 relative to the pattern allocation of FIG. 6, and after correction.
Figure 20:
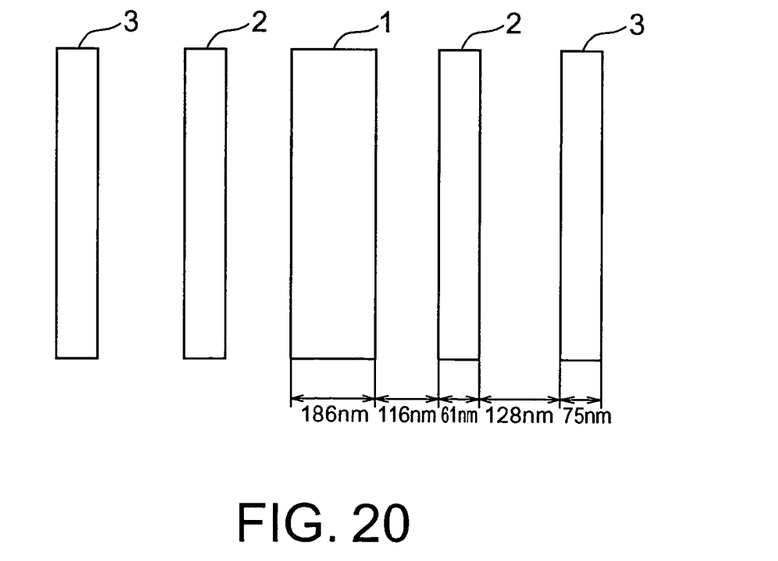
FIG. 20 is a view of pattern allocation after the process of the model-based OPC in the embodiment 2 relative to the pattern allocation of FIG. 7, and after correction.

FIGS. 19 and 20 shows corresponding pattern sizes after correction. In the dense pattern shown in FIG. 19, a width of a line pattern 1 becomes thicker from 160 nm to 188 nm, and a width of an auxiliary pattern 2 becomes thinner from 80 nm to 56 nm, which is thinner than that of the embodiment 1. The interval between edges of the line pattern and the auxiliary pattern is 108 nm, which is almost the same. In the isolated pattern shown in FIG. 20, a width of a line pattern 1 becomes also thicker from 160 nm to 186 nm, and a width of an auxiliary pattern 2 becomes thinner from 80 nm to 61 nm, which is thinner than that of the embodiment 1. Likewise, a width of an auxiliary pattern 3 is corrected to become thinner from 80 nm to 75 nm. The interval between the edge of the pattern and the edge of the auxiliary pattern becomes from 110 nm to 116 nm, and the interval between the auxiliary patterns is altered from 130 nm to 128 nm.

In the present embodiment, even when the resist with short acid diffusion length is used, it is possible to correct the auxiliary pattern for matching a resist feature, and there is an effect to adapt it to various resists. In the embodiment described above, the threshold of the auxiliary pattern is set 10% higher than the threshold of the pattern, but this is adjustable by varying margin of the amount of the exposure light required. To secure large leeway of the auxiliary pattern transfer in case of underexposure, the threshold of the auxiliary pattern can be raised as required. On the contrary, in such a case in which the light exposure margin is rate-determined in the other portion of the pattern and a margin for the auxiliary pattern transfer is not necessary, it is not necessary to raise the threshold up to 10%. Also, instead of adding bias to the target auxiliary pattern, it is possible to obtain the same correction result by using a method of setting the threshold much higher.

In these embodiments, KrF (wavelength $\lambda$=248 nm) is used, however wavelength is not especially limited. For example, the same applies to a case using a reflection mask such as EUV exposure (wavelength=13 nm). Also, even though the model-based OPC is simultaneously performed to the line pattern and the auxiliary pattern in the above embodiment, the OPC can be performed first to the auxiliary pattern and then to the line pattern. In this case, it is also possible to prevent transfer of the auxiliary pattern, and to obtain a desired size of the line pattern. Furthermore, the pattern shape is not limited to the line pattern, but a hole and slit-shaped draw pattern can be also applied.

In the present invention, by making use of the fact that, as the same as a pattern, an auxiliary pattern with a narrow width can be also corrected by using a model-based OPC in a pattern interval of a certain range, an auxiliary pattern width is optimally corrected while taking account of a result of the pattern correction, after the auxiliary pattern with a fixed width is allocated by using the model-based OPC. As a first stage, the auxiliary pattern with a fixed width by using the rule-based method according to the pattern interval of the middle pitch pattern. In a second stage, the optimal pattern width is determined by using the model-based OPC. In this instance, the light intensity threshold of the auxiliary pattern is 1.0 to 1.4 times of the light intensity threshold of the pattern. Thereby, a data pattern with a designated value can be obtained. According to the steps of the present invention, a mask data creation method for obtaining a data pattern with a desired value, and a mask used for manufacturing a semiconductor device are obtained.

The explanation is made above based on the embodiments of the present invention. However, it should be noted here that the present invention is not limited to the above embodiments, but can be variously modified and changed within the gist of the present invention.

What is claimed is:

1. A method of creating data of a mask for manufacturing a semiconductor device, the mask comprising at least one auxiliary pattern arranged adjacent to a line pattern, comprising:
   allocating the at least one auxiliary pattern in accordance with a rule-based method on the basis of an interval between a first line pattern and a second line pattern adjacent to the first line pattern; and
   optimizing a size of the at least one auxiliary pattern in accordance with a model-based OPC (Optical Proximity Correction), by shifting edges of the at least one auxiliary pattern and edges for one of the line patterns on the basis of a first light intensity threshold on the at least one auxiliary pattern and a second light intensity threshold on the line patterns.

2. The method claimed in claim 1, wherein the first light intensity threshold is higher than the second light intensity threshold.

3. The method claimed in claim 2, wherein the first light intensity threshold is from 4% to 40% higher than the second light intensity threshold.

4. The method claimed in claim 1, the optimizing comprising giving an offset to the at least one auxiliary pattern so that the at least one auxiliary pattern is not transferred from the mask onto a resist layer on a semiconductor substrate.

5. The method claimed in claim 1, wherein a width of the at least one auxiliary pattern allocated in the step of allocating is fixed.

6. The method claimed in claim 1, wherein:
   a table including a relationship between a range of the interval between the first line pattern and the second line pattern and a position where the at least one auxiliary pattern is allocated; and
   the optimizing comprising optimizing a width of the at least one auxiliary pattern and widths of the first and the second line patterns.

7. The method claimed in claim 6, wherein the table includes a relationship between a location and a corresponding number of the at least one auxiliary pattern to be allocated.

8. A method of creating data of a mask for manufacturing a semiconductor device, the mask comprising at least one auxiliary pattern arranged adjacent to a shaped pattern, comprising:
   allocating the at least one auxiliary pattern in accordance with a rule-based method on the basis of an interval between a first shaped pattern and a second shaped pattern adjacent to the first shaped pattern; and
   optimizing a size of the at least one auxiliary pattern in accordance with a model-based OPC (Optical Proximity Correction), by shifting edges of the at least one auxiliary pattern and edges for one of the shaped patterns on the basis of a first light intensity threshold on the at least one auxiliary pattern and a second light intensity threshold on the shaped patterns.

9. The method claimed in claim 8, wherein the first light intensity threshold is from 4% to 40% higher than the second light intensity threshold.

10. The method claimed in claim 8, the optimizing comprising giving an offset to the at least one auxiliary pattern so that the at least one auxiliary pattern is not transferred from the mask onto a resist layer on a semiconductor substrate.

11. The method claimed in claim 8, wherein a width of the at least one auxiliary pattern allocated in the step of allocating is fixed.

12. The method claimed in claim 8, wherein the shaped patterns are one of line patterns, hole patterns, and slit-shaped draw patterns.

13. A method of creating data of a mask, which includes at least one auxiliary pattern arranged adjacent to a line pattern, comprising:
   allocating the at least one auxiliary pattern in accordance with a rule-based method on the basis of an interval between a first line pattern and a second line pattern adjacent to the first line pattern; and
   optimizing a size of the at least one auxiliary pattern in accordance with a model-based OPC (Optical Proximity Correction), by setting a condition for shifting edges of the at least one auxiliary pattern and edges for one of the line patterns in which a first light intensity threshold on the at least one auxiliary pattern is higher than a second light intensity threshold on the line patterns to avoid transferring the at least one auxiliary pattern from the mask onto a resist layer.

* * * * *